(12) United States Patent
Colbert et al.

(10) Patent No.: US 6,988,533 B2
(45) Date of Patent: Jan. 24, 2006

(54) METHOD AND APPARATUS FOR MOUNTING A HEAT TRANSFER APPARATUS UPON AN ELECTRONIC COMPONENT

(75) Inventors: John Lee Colbert, Byron, MN (US); Roger Duane Hamilton, Eyota, MN (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 10/607,361

(22) Filed: Jun. 26, 2003

(65) Prior Publication Data

US 2005/0006055 A1  Jan. 13, 2005

(51) Int. Cl.
*F28F 7/00* (2006.01)
(52) U.S. Cl. .................. 165/80.3; 165/185; 361/697; 361/704; 257/718; 257/727
(58) Field of Classification Search .............. 165/80.3, 165/185, 104.33, 121; 361/697, 704; 257/718, 257/719, 706, 727
See application file for complete search history.

(56) References Cited

U.S. PATENT DOCUMENTS

| | | | |
|---|---|---|---|
| 4,471,837 A | 9/1984 | Larson | |
| 5,109,317 A * | 4/1992 | Miyamoto et al. | 361/715 |
| 5,523,560 A | 6/1996 | Manique et al. | |
| 5,932,925 A * | 8/1999 | McIntyre | 257/719 |
| 6,031,751 A | 2/2000 | Janko | |
| 6,058,014 A * | 5/2000 | Choudhury et al. | 361/704 |
| 6,075,701 A | 6/2000 | Ali et al. | |
| 6,374,906 B1 * | 4/2002 | Peterson et al. | 165/80.3 |
| 6,450,248 B1 * | 9/2002 | Chang | 165/80.3 |
| 6,462,945 B2 * | 10/2002 | Sloan et al. | 361/687 |
| 6,462,951 B2 * | 10/2002 | Letourneau | 361/704 |
| 6,503,626 B1 * | 1/2003 | Norley et al. | 428/408 |

* cited by examiner

*Primary Examiner*—Terrell McKinnon
(74) *Attorney, Agent, or Firm*—Leslie J. Payne

(57) ABSTRACT

A heat transfer apparatus comprises a thermally conductive member including a base having one or more surfaces adapted to absorb heat from an electronic component, and a mounting assembly including at least one mounting member directly coupled to the base and for direct attachment to the electronic component so that loading forces for mounting on it the electronic component are not directly applied to the base. The thermally conductive member is a graphite-based material. A compliant force applying mechanism is mounted generally on the base for controlling forces applied on the base.

13 Claims, 5 Drawing Sheets

METHOD AND APPARATUS FOR MOUNTING A HEAT TRANSFER APPARATUS UPON AN ELECTRONIC COMPONENT

BACKGROUND OF THE INVENTION

The present invention relates generally to a method and apparatus for transferring heat from an electronic component. More particularly, it relates to methods and apparatus for mounting graphite-based heat transfer apparatus upon electronic modules in a manner for reducing material and thermal degradations of the former.

Electronic components, such as microprocessors and integrated circuits, must operate within certain specified temperature ranges to perform efficiently. Excessive heat, however, degrades their performance, reliability, life expectancy, and even causes failure. For controlling excessive heat, heat sinks are a typical thermal management protocol. It is not uncommon to have heat sinks formed with fins or other similar structures to increase the surface area of the heat sink, whereby air can pass to thereby enhancing heat dissipation. Typically, heat sinks are formed of metals, such as copper or aluminum, because they readily absorb heat and transfer it about their entire structure.

Recently, graphite-based materials have been used for heat sinks, and they offer many advantages over the metallic kinds. For instance, the anisotropic nature of graphite allows preferential direction of heat from an external surface of an electronic component to the heat dissipation fins. This is compared to the isotropic nature of metallic heat sinks, wherein the heat transmitted by the heat sink is distributed about the structure rather than being directed to the fins; which are the most efficient heat dissipation area. Graphite materials have the further advantage of relatively low density, and thus relatively low weight, whereby a graphite apparatus of the same approximate size and volume of a copper apparatus will weigh significantly less. In addition, a significant advantage of graphite over metals can be expressed in terms of improved thermal conductivity. Therefore, graphite is distinctly advantageous.

Despite such advantages, however, limitations on its use nevertheless exist. Shortcomings are present, for example, in environments requiring relatively high actuating load forces being applied thereto. These are due primarily to the tendency of graphite to crack and fracture when subjected to heavy loading. One example is when attempting to mount a graphite heat sink on a multi-chip module (MCM), wherein forces of several hundred pounds are required to be applied to the heat sink for mounting purposes. Such cracking can cause corresponding cracking in the thermal paste at the thermal interface, thereby lessening thermal conductivity. These constraints are compounded by the requirement that the graphite heat sink be compliant to the shape of prior heat sinks used in a MCM environment.

Therefore, without the ability for effectively transferring heat from an electronic component, especially in an MCM environment, by using graphite-based heat sinks in a manner that avoids mechanical and thermal degradations, the true potential of using such heat sinks is not entirely realized.

SUMMARY OF THE INVENTION

The present invention provides an enhanced heat transfer apparatus and method of mounting the same upon electronic components in a manner substantially without negative effect and that overcome many of the disadvantages of prior art arrangements.

In accordance with one aspect of the present invention, provision is made for a heat transfer apparatus comprising: a thermally conductive including a base having one or more surfaces adapted to absorb heat from an electronic component and one or more surfaces extending from the base to radiate absorbed heat; and, a mounting assembly including at least one mounting member directly coupled to the base and for direct attachment to the electronic component so that loading forces for mounting on it the electronic component are not directly applied to the base.

In an illustrated embodiment, the thermally conductive member is a graphite-based material.

In an illustrated embodiment, the heat transfer apparatus further comprises a compliant force applying mechanism mounted generally on the base for controlling forces applied on the base for effecting a firm thermal transfer engagement with the electronic component.

In accordance with another aspect of the present invention, provision is made for a method of transferring heat from an electronic component, comprising the steps of: providing a graphite-based heat transfer apparatus including a base having one or more surfaces adapted to absorb heat from an electronic component and one or more surfaces extending from the base to radiate absorbed heat; providing a mounting assembly including at least one mounting member directly coupled to the base and for direct attachment to the electronic component; and, mounting the mounting assembly which is coupled to the heat transfer apparatus directly on the on the electronic component so that loading forces for mounting it on the electronic component are not directly applied to the base.

In an illustrated embodiment, the method comprising the step of: applying compliant forces on the base by a compliant force applying mechanism mounted directly on the base.

It is, therefore, a principal aspect of this invention to provide for significant improvements in the transfer of heat from a heat source, such as an electronic component using a heat transfer apparatus that address the above-mentioned concerns.

It is an exemplary aspect of the present invention to provide for significant improvements relative to the transfer of heat from an electronic component, such as a multiple chip assembly using a graphite-based heat transfer apparatus.

It is another aspect of the present invention to provide for a simple and cost effective approach for transferring heat from an electronic component using a graphite-based heat transfer apparatus. This is done in a manner, which substantially reduces a tendency of the graphite material to mechanically and thermally degrade.

It is yet another aspect of the present invention to provide for a compliant actuating mechanism for allowing adjustment of actuating forces applied by the apparatus to thereby adjust the forces being applied at the heat transfer interface, whereby a more uniform and efficient transfer of heat occurs.

It is still another aspect of the present invention to use graphite heat sinks that can be mechanically loaded on an electronic component without inducing failure in the graphite as by crack generation and propagation or even inducing discontinuities in the adhesive layers at the thermal interfaces.

BRIEF DESCRIPTION OF THE DRAWINGS

For a more complete understanding of the present invention, reference is now made to the following detailed description of preferred examples of the present invention illustrated in the accompanying drawings in which.

DETAILED DESCRIPTION

Reference is now made to FIGS. 1–5 for illustrating one preferred embodiment of a heat transfer apparatus 10 made according to the present invention, which implements an improved process of mounting the same on a heat source, such as an electronic component 12. In this embodiment, the electronic component 12 is a multi-chip module (MCM) 12.

Figure 1:
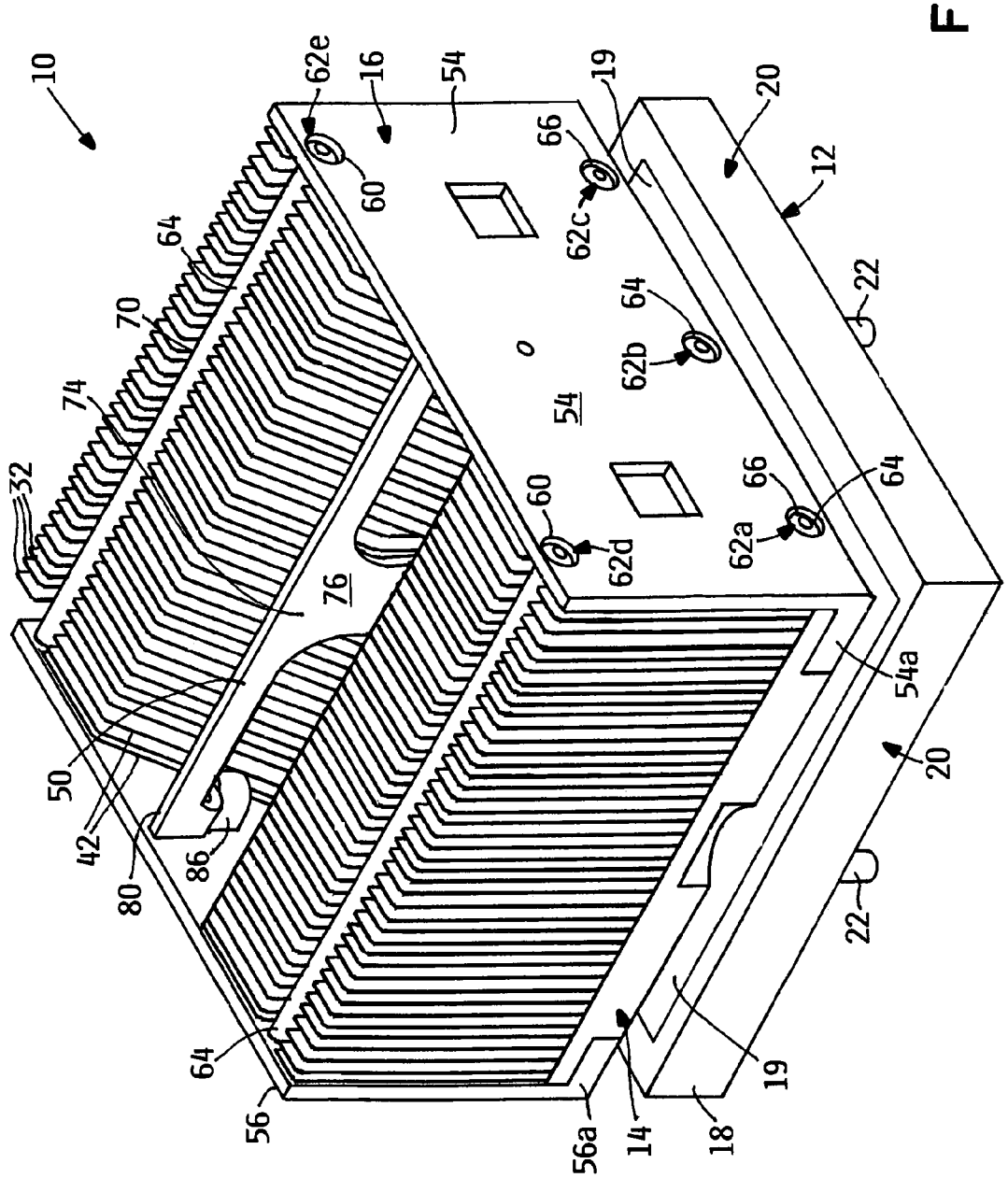
FIG. 1 is a perspective view of one preferred embodiment of a heat transfer apparatus of the present invention illustrating the actuation bar assembly in an assembled condition.
Figure 2:
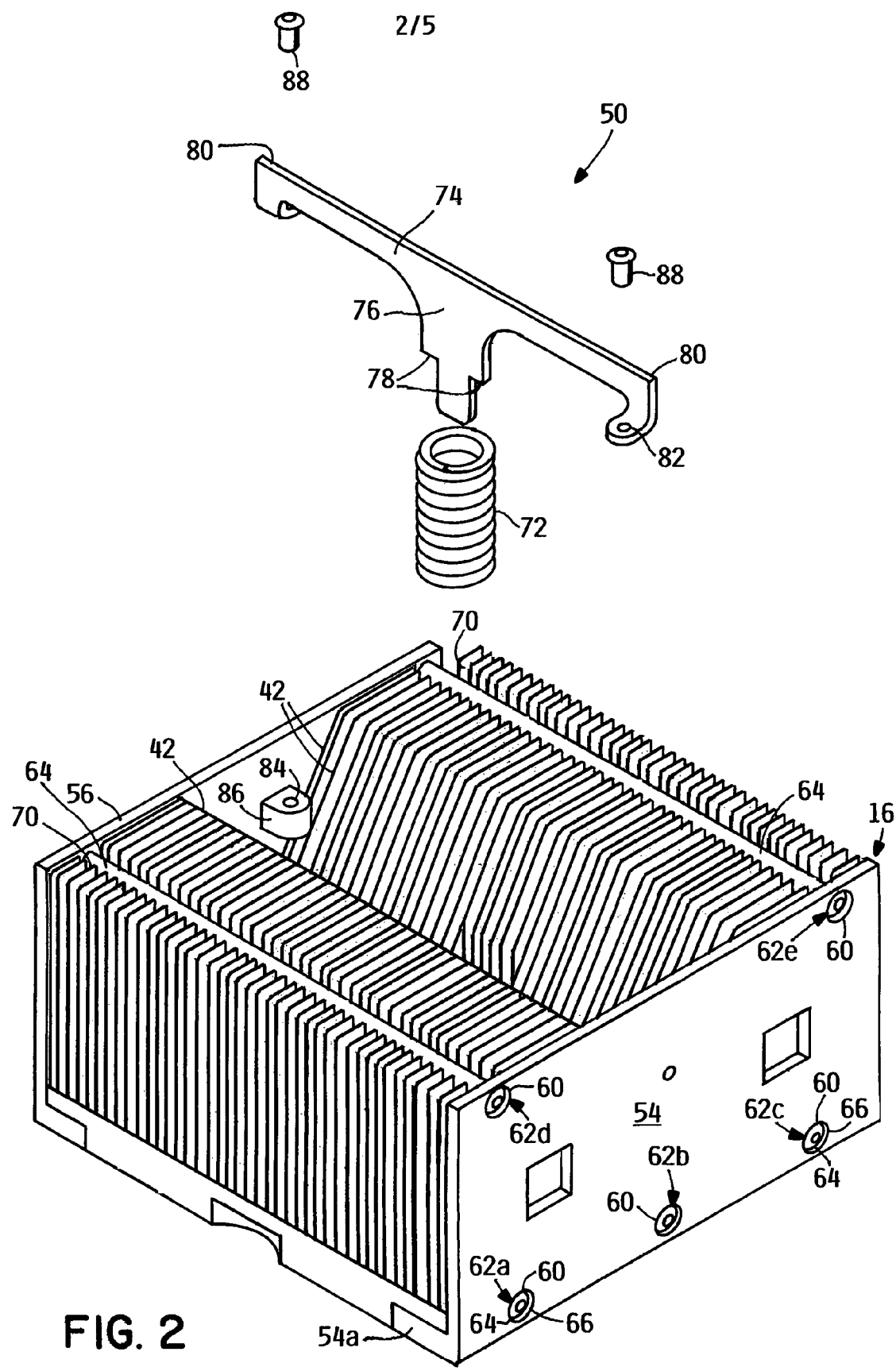
FIG. 2 is a view similar to FIG. 1 illustrating the actuation bar assembly in an exploded perspective view.

The heat transfer apparatus 10 essentially includes a thermal conducting element 14 and a mounting assembly 16 for removable mounting upon the MCM 12. The MCM 12 includes a MCM housing assembly 18 that houses a multi-chip module substrate 19 (FIGS. 1 & 3) which when operable generates the heat that is to be transferred by this embodiment. The MCM housing assembly 18 includes an annular cap 20 that has a configuration, which generally matches the periphery of the MCM 12. The annular cap 20 is a thermally conductive material, such as copper and provides many features that are not described herein since they do not, per se, form an aspect of the present invention. The multi-chip module 12 can be commercially available from International Business Machines Corporation of Armonk, N.Y. It will be understood that the present invention is not limited to the described MCM. As seen in FIG. 1, a plurality of upstanding loading posts 22 are, preferably, installed one each at the midpoints along each edge of the perimeter of the annular cap 20. In a well-known manner, the loading posts 22 transmit the actuation loads that compress an LGA interposer (not shown) to electrically mate with the MCM housing assembly 18. Typically, the forces generated by the loading posts amount to several hundred pounds and are transferred to the heat transfer apparatus 10 to affect the desired heat transfer condition. In this regard, attachment screws 24 (FIG. 5) connect the MCM housing assembly 18 to threaded attachment openings 26 in the heat transfer apparatus 10 and extend from a plane opposite from which the load posts extend.

It is preferred, that the thermally conducting element 14 is primarily made of a graphite-based base block 30, which acts to absorb the heat, that is to be transferred from the multi-chip module substrate 19. The graphite-based base block 30 can have any desired shape or size including the generally rectangular configuration illustrated. A generally planar bottom surface 34 (FIG. 5) is formed on the bottom of the heat transfer apparatus 10 and it is adapted to form a major heat collection surface area. The graphite-based block 30 is made, preferably, of a compressed resin and graphite mixture, but the present invention envisions other suitable graphite materials and composites including bulk graphite. Although this embodiment is described in the context of protecting graphite-based materials, the invention envisions protecting other similar materials, which might degrade materially when subjected to the forces noted above. Preferably, a thermal heat transfer layer 36 (FIG. 3) is used for effecting good heat transfer at the thermal interface between the graphite base block 30 and the multi-chip module substrate 19. The thermal heat transfer layer 36 is ideally a high-end commercially available thermal compound. Other heat transfer layers, such as thermal greases, thermally conductive elastomers, pads, and tapes, can be used or even none at all. The thermal interface layer 36 is relatively thin so that it may easily transfer heat away from the module assembly. If a solid material is utilized, the thermal interface layer can have corresponding cutouts for the attachment screws 24 or the like.

A plurality of spaced apart and parallel graphite-based thermally conductive heating elements or heat radiating fins 32 are attached on a top surface of the graphite-base block 30 in either an integrated or an integral manner. An epoxy layer 38 (FIG. 2) secures the generally identically shaped heat radiating elements 32, or fins 32 to the graphite-based block 30. The epoxy layer 38 (FIG. 3) is intended to fill the spaces between the adjacent heat radiating fins 32 and defines the spacing therebetween. Any suitable epoxy that is commercially available can be used. Other suitable forms of thermally conductive adhesives are envisioned. Although heat radiating fins are preferred, the present invention envisions use of other heat dissipating surfaces. Each of the heat radiating fins 32 have the plate-like or panel configuration illustrated. As noted, mutually opposing edges 42 (FIGS. 1 & 2) of the fins taper toward each other. The heat radiating fins 32 are arranged in the manner illustrated in two sets on opposing sides of a compliant force applying mechanism 50.

Figure 3:
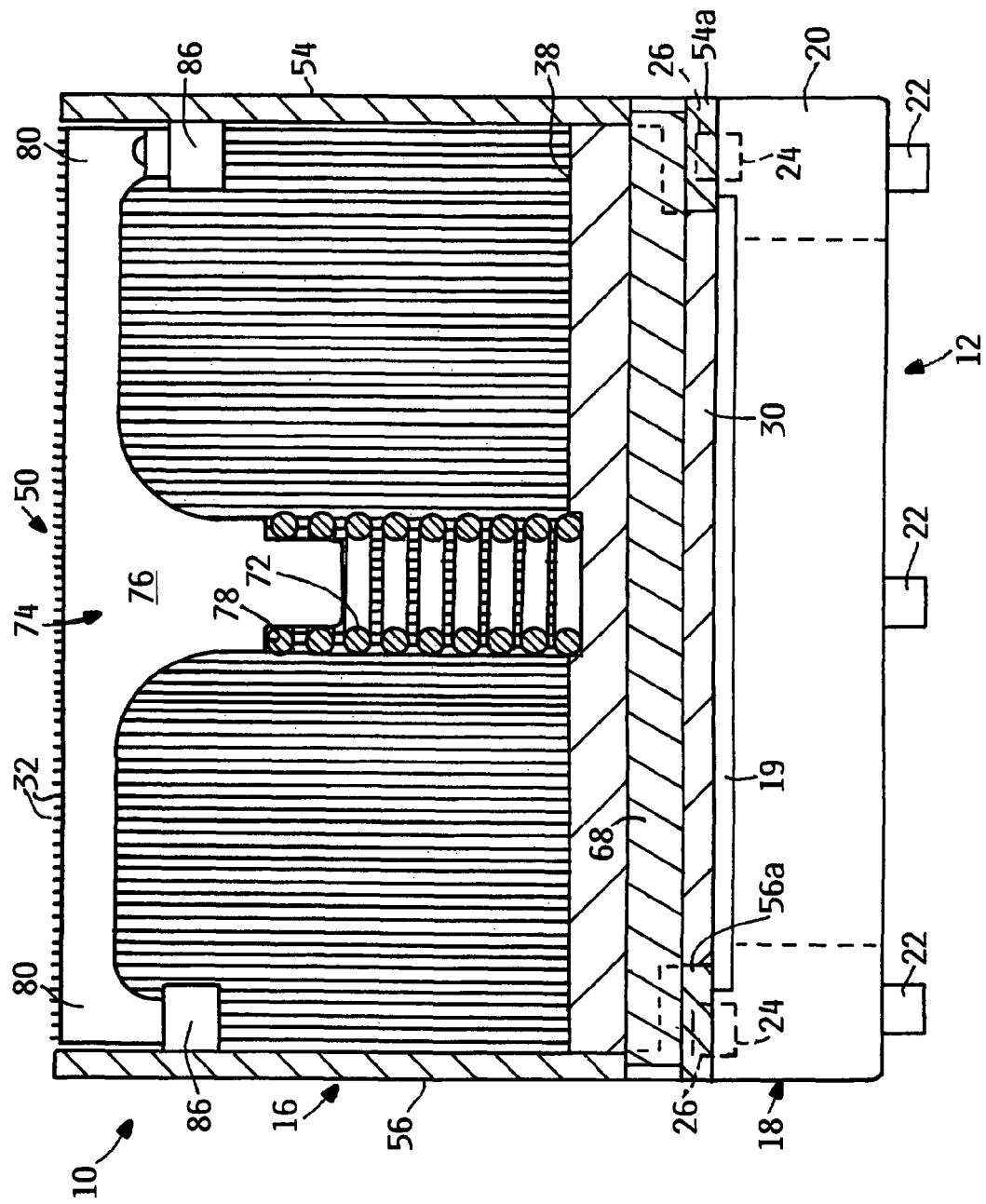
FIG. 3 is a side elevation view of the heat transfer apparatus illustrated in FIG. 1.
Figure 4:
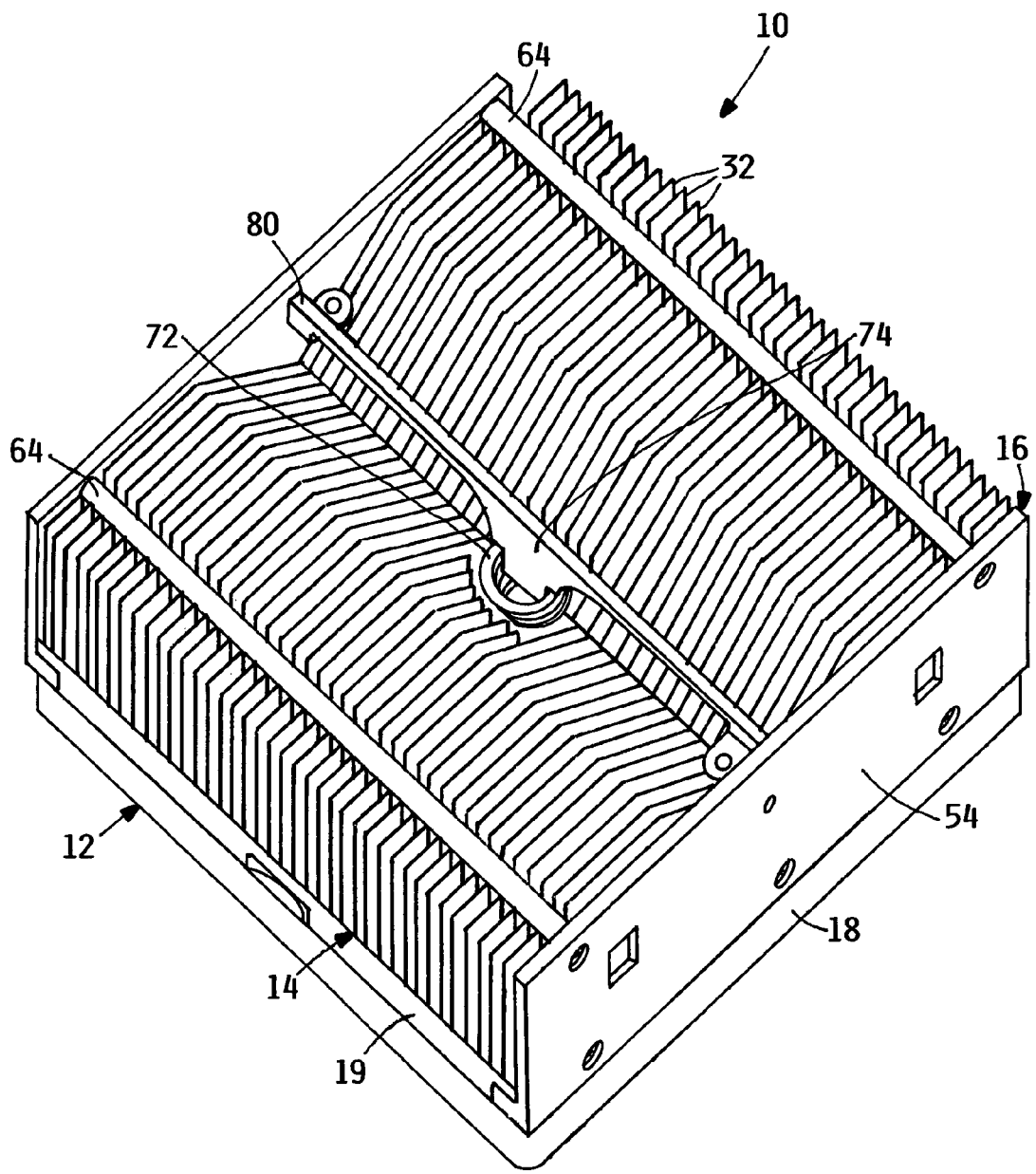
FIG. 4 is a plan view of the heat transfer apparatus illustrated in FIG. 1.
Figure 5:
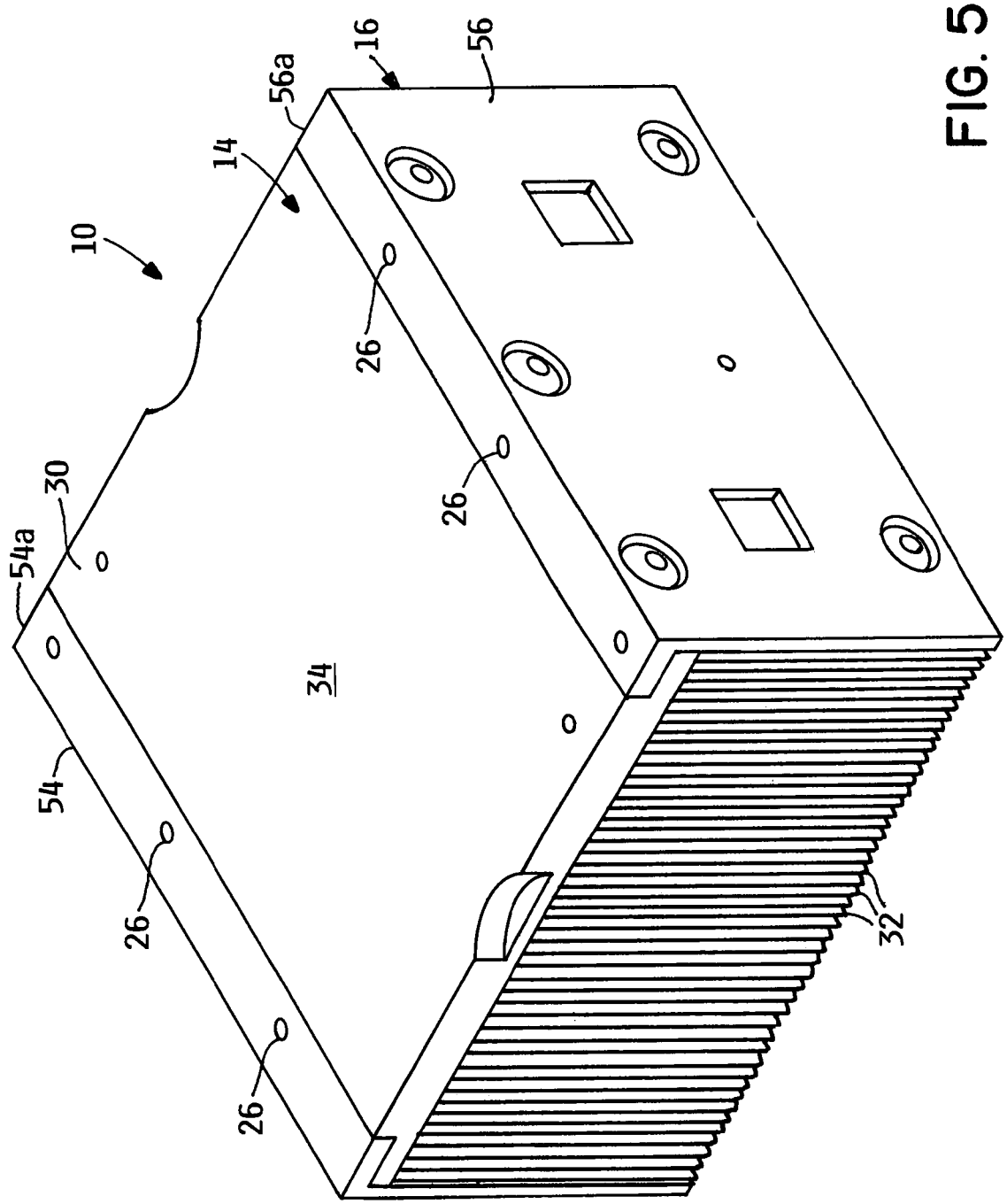
FIG. 5 is a perspective view of the bottom of the heat transfer apparatus of FIG. 1.

The mounting assembly 16 is directly connected to the MCM housing assembly 18 generally centrally between the heat radiating fins 32. The mounting plates 54, 56 have a generally L-shaped configuration with the shorter leg portions 54a, 56a (FIG. 2); respectively, mounted upon the recessed edges 52. Each of the plates 54, 56 has an aligned set of openings 60, which receive a corresponding fastening assembly 62a–e; such as a tie rod type. Each of the fastening assemblies 62a–e includes an elongated tie rod 64 that is threadedly engaged at one end by a threaded nut 66. Each of the fastening assemblies 62a–c extends though separate longitudinally extending bores 68; one of which is shown in FIG. 3. The bores are laterally spaced apart in the base block and have diameters that are sufficiently wide so as to prevent deflected fastening assemblies engaging the graphite base block when the assemblies are loaded. The fastening assemblies 62d–e extend through aligned recesses 70 in the heat radiating fins 32 for further insuring a rigid connection of the mounting assembly. The fastening assemblies can be made of any suitable heat conducting material. The attachment openings 26 (FIG. 3) are formed on the shorter leg portions 54a, 56a, and are adapted to receive one of the threaded members 18. Accordingly, the high loading forces for joining the heat transfer apparatus 10 to the multi-chip module 12 will be taken up by the mounting plates and not the base block 30.

The compliant force applying mechanism 50 includes at least a biasing element 72, or coil spring 72 and a generally T-shaped force applying actuator member 74 or actuator bar 74. The compliant force applying mechanism 50 is preferably disposed in a central area encompassed or surrounded by the heat radiating fins 32. The coil spring 72 is centrally disposed about a shaft 76 of the actuator bar and extends upright between lateral edges 78 and the top of the base block. Radial extending arms 80 of the force applying actuator bar 74 have openings 82 that are to be aligned with threaded openings 84 on internal projections 86 for receiving threaded members 88. The force applying actuator bar 74 is made, preferably, of a sturdy and heat-conducting material, such as annealed steel. By adjusting the threaded members 88, the force applying actuator bar 74 can adjustably compress the coil spring 72 to adjust the pressure on the center of the base block 30. This serves the purposes of effecting a more intimate thermal engagement at the thermal interface layer 36 directly above the heat generating substrate 19 and counteracting bending of the center of the base block 30, which is induced when the mounting assembly 16 is mounted on the MCM 12. The compliant forces can be adjusted and are intended to maintain a more efficient heat conducting relationship at the thermal interface layer 36 without causing cracking of the base block 30 and the thermal layer. The compliant force applying mechanism 50 is versatile and, of course, equivalent adjustable force applying mechanisms are contemplated.

Accordingly, the mounting assembly and the compliant force applying mechanism avoid inducing failure in the graphite as by crack generation and propagation or even inducing discontinuities in the adhesive layers at the thermal interfaces.

The embodiments and examples set forth herein were presented to best explain the present invention and its practical applications and to enable those skilled in the art to make and use the invention. However, those skilled in the art will recognise that the foregoing description and examples have been presented for the purposes of illustration and example only. The description set forth is not intended to be exhaustive or to limit the invention to the precise forms disclosed. Many modifications and variations are possible in light of the above teachings without departing from the spirit and scope of the appended claims.

What is claimed is:

1. A heat transfer apparatus comprising:
a thermally conductive member including a base having one or more surfaces adapted to absorb heat from an electronic component and one or more surfaces extending from the base to radiate absorbed heat; and,
a mounting assembly including at least one mounting member directly coupled to the base and for direct attachment to the electronic component so that loading forces for mounting on it the electronic component are not directly applied to the base;
further comprising a compliant force applying mechanism mounted generally on the base for controlling forces applied on the base; wherein the compliant force applying mechanism includes at least a biasing element, and a force applying actuator member; wherein the biasing element is a coil spring is disposed about a shaft of the actuator member between lateral edges of the member and the top of the base, the actuator member comprises a pair of radially extending arms, each of which has an opening for receiving a threaded member which is received by the mounting assembly, whereby by adjusting the threaded members, the actuator member can adjustably compress or relax the coil spring so as to adjust the force on the center of the base.

2. The heat transfer apparatus of claim 1, wherein the thermally conductive member is a graphite-based material.

3. A heat transfer apparatus comprising:
a thermally conductive member including a base having one or more surfaces adapted to absorb heat from an electronic component and one or more surfaces extending from the base to radiate absorbed heat; and,
a mounting assembly including at least one mounting member directly coupled to the base and for direct attachment to the electronic component so that loading forces for mounting on it the electronic component are not directly applied to the base;
wherein the mounting assembly includes a pair of mounting members which are interconnected to each other by fastening assemblies, wherein the fastening assemblies extend through openings in the base.

4. The heat transfer apparatus of claim 3, wherein the mounting members include portions that are received within corresponding recesses of the base, and the portions allow direct attachment thereof to the electronic component.

5. The heat transfer apparatus of claim 3, wherein the mounting members are made of a heat conducting material.

6. The heat transfer apparatus of claim 4, wherein the mounting members have a generally L-shaped configuration.

7. A method of mounting a heat transfer apparatus to an electronic component, comprising:
providing a graphite-based heat transfer apparatus including a base having one or more surfaces adapted to absorb heat from an electronic component and one or more surfaces extending from the base to radiate absorbed heat;
providing a mounting assembly including at least one mounting member directly coupled to the base and for direct attachment to the electronic component; and,
mounting the mounting assembly which is coupled to the heat transfer apparatus directly on the on the electronic component so that loading forces for mounting it on the electronic component are not directly applied to the base;
wherein mounting the mounting assembly to the base includes a pair of mounting members that are interconnected to each other by fastening assemblies, wherein the fastening assemblies extend through openings in the base.

8. The method recited in claim 7 further comprising the step of: applying compliant forces on the base by a compliant force applying mechanism mounted directly on the base.

9. The method recited in claim 8 wherein the compliant forces are applied by the compliant force applying mechanism using a coil spring that is centrally disposed about a shaft of an actuator member between lateral edges of the actuator member and the top of the base.

10. The method recited in claim 7, wherein the mounting members include portions which are received within corresponding recesses of the base, and the portions allow direct attachment thereof to the electronic component.

11. A heat transfer apparatus comprising: a thermally conductive member including a base having one or more surfaces adapted to absorb heat from an electronic component and one or more surfaces extending from the base to radiate absorbed heat, the thermally conductive member is a graphite-based material; the surfaces extending from the base includes a plurality of thermally conducting elements;
a mounting assembly including at least one mounting member directly coupled to the base and for direct attachment to the electronic component so that loading forces for mounting it on the electronic component are not directly applied to the base, the mounting assembly includes a pair of mounting members which are interconnected to each other by fastening assemblies, wherein the fastening assemblies extend through openings in the base; and, a compliant force applying mechanism mounted generally on the base in an area encompassed by the thermally conducting elements for controlling forces applied on the base; the compliant force applying mechanism includes at least a biasing element, and a force applying actuator member, the biasing element extends between the actuator member and a top surface of the base.

12. The heat transfer apparatus of claim 11, wherein the actuator member includes a shaft, the biasing element includes a coil spring in which the shaft is disposed, the coil spring extends between the actuator member and a surface of the base.

13. The heat transfer apparatus of claim 12, wherein the actuator member includes a pair of radially extending arms, each of which has an opening for receiving a threaded member that is received by the mounting assembly, whereby the actuator member can adjustably compress or relax the coil spring so as to adjust the pressure on the base by adjusting the threaded members.

* * * * *